(12) United States Patent
Mentgen et al.

(10) Patent No.: US 6,531,874 B2
(45) Date of Patent: Mar. 11, 2003

(54) METHOD AND DEVICE FOR DETERMINING THE CHARGE STATUS OF A BATTERY

(75) Inventors: Dirk Mentgen, Schwieberdingen (DE); Eberhard Schoch, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/989,792

(22) Filed: Nov. 19, 2001

(65) Prior Publication Data

US 2002/0101243 A1 Aug. 1, 2002

(30) Foreign Application Priority Data

Nov. 17, 2000 (DE) ......................... 100 56 971

(51) Int. Cl.⁷ ............................ G01N 27/416
(52) U.S. Cl. ........................................... 324/427
(58) Field of Search ..................... 324/427; 702/63

(56) References Cited

U.S. PATENT DOCUMENTS 5,432,429 A * 7/1995 Armstrong, II et al. .... 320/136
5,847,566 A * 12/1998 Marritt et al. ............... 324/427

FOREIGN PATENT DOCUMENTS

DE        19705634        8/1998

* cited by examiner

*Primary Examiner*—Gregory J. Toatley, Jr.
*Assistant Examiner*—Pia Tibbits
(74) *Attorney, Agent, or Firm*—Kenyon & Kenyon

(57) ABSTRACT

A method of determining the charge status of a battery, in particular an automotive battery, comprising the following steps:

- determining a first battery charge status $soc_{U0}$ on the basis of a measurement of the no-load voltage of the battery,
- determining a second battery charge status $soc_i$ on the basis of integration of a battery current over time, and
- forming a weighted average from battery charge states $soc_{U0}$ and $soc_i$ thus determined, to obtain an average battery charge status soc.

6 Claims, 1 Drawing Sheet

METHOD AND DEVICE FOR DETERMINING THE CHARGE STATUS OF A BATTERY

FIELD OF THE INVENTION

In a subsequent step 103, the integral of the battery current over time is determined. Step 103 can be carried out immediately after initiation of the starting operation, or it may also be carried out at any desired time during battery operation. Suitable periods of time over which the integral is determined are obtained in a conventional manner.

BACKGROUND INFORMATION

The operability of the starter battery of the internal combustion engine in a motor vehicle (or any other system powered primarily by an internal combustion engine) is one of the most important prerequisites for ensuring operating reliability. An internal combustion engine is generally started by an electric starter which draws power for the starting operation from the starter battery. The starter must briefly apply a torque capable of turning over the internal combustion engine at a certain minimum rpm. To do so, a sufficiently high current must flow through the starter or a sufficiently high voltage must be applied to the starter. If the starter battery is very cold, partially discharged or severely aged, its internal resistance may be so high that insufficient current and voltage are available to ensure this starting operation. Such a problem is described in German Patent No. 19705634 C2, for example.

An attempt has been made to determine the charge status of a battery, in particular an automotive lead-acid battery, based on a known initial charge status, e.g., a full charge, by integration of the battery current over time. However, in this case the charge status must be recalibrated at certain intervals because of errors that occur in measuring the current and in current integration and because of battery gassing currents. For example, it is conceivable here to use the open-circuit voltage, which can be determined with a battery with no load connected to it after a lengthy resting phase, in particular lasting for more than four hours, and is proportional to the charge status. However, it has been found that the accuracy of such methods is inversely proportional to the length of the resting phase, i.e., such methods lead to unsatisfactory results in the case of operating cycles with short resting phases such as taxi operation.

SUMMARY OF THE INVENTION

An object of the present invention is to improve on the accuracy of methods of determining the charge status of a battery, in particular for operating cycles with short resting phases.

In contrast with known methods of determining the charge status, where current integration and recalibration must be performed, in the method according to the present invention the current integral is not replaced by a calibration value but instead it is corrected by an instantaneously measurable no-load voltage $U_0$ to form a weighted mean. It is also possible with this measure to use short resting phases, in particular resting phases lasting less than four hours, with a battery under no load for correction of the current integral, so that errors occurring in current integration can be minimized relative to the errors occurring in traditional methods, in particular with corresponding operating cycles with short resting phases (especially in taxi operation). Another advantage of the method according to the present invention is that errors in determination of the open-circuit voltage from longer resting pauses have less effect on the charge status determined. Thus on the whole, the accuracy in charge status determination when using current integration methods is improved by the method according to the present invention.

According to a preferred embodiment of the method according to the present invention, the weighted mean is used to determine charge status soc on the basis of an equation in the form:

$$soc=(1-gew)*soc_i+gew*soc_{U0} \quad (1)$$

where gew is a weighting factor for which the inequality $0 \leq gew \leq 1$ holds. The introduction of such a weighting factor can be handled relatively easily by computing, and the software complexity required to carry out the method according to the present invention can be kept low.

It is especially preferable that the weighting factor is selected on the basis of an equation of the form:

$$gew=1-\exp(-t_R/T_R) \quad (2)$$

where $t_R$ is the duration of a resting phase prior to the measurement, and $T_R$ is the time constant of the transient response of no-load voltage $U_0$ until it reaches open-circuit voltage $U_R$ of the battery. In conventional terminology, open-circuit voltage $U_R$ is understood to be a no-load voltage $U_0$ which is ultimately established after a prolonged period of no load condition and which depends on the battery temperature and its history (charging or discharging before the resting phase).

DETAILED DESCRIPTION

According to a preferred embodiment of the method according to the present invention, the no-load voltage of a battery whose charge status is to be determined is itself determined in a step 101. This step is preferably carried out during or immediately after a resting phase or immediately before a starting operation of an internal combustion engine, which is in operative connection with the battery. In a step 102, charge status $soc_{U0}$ of the battery is calculated in a known manner on the basis of no-load voltage $U_0$ thus determined.

In a subsequent step 103, the integral of the battery current over time is determined. Step 103 can be carried out immediately after initiation of the starting operation, or it may also be carried out at any desired time during battery operation. Suitable periods of time over which the integral is determined are obtained from the concrete givens in a known manner.

Then in a step 104, another charge status $soc_i$ is calculated on the basis of the battery current integral thus determined.

Finally, in a step 105 an average is formed from the determined and calculated charge status values $soc_{U0}$ and $soc_i$ to obtain an average charge status soc.

Weighting for the averaging of step 105 is preferably performed on the basis of an equation of the form:

$$soc=(1-gew)*soc_i+gew*soc_{U0} \text{ where } 0 \leq gew \leq 1.$$

Weighting factor gew is selected as a function of an accuracy, in particular a known or estimated accuracy, of open-circuit voltage $U_R$ thus determined, which in turn depends on duration $t_R$ of the resting phase. It has proven to be expedient to select a weighting factor gew according to an equation of the form:

$$gew = 1 - \exp(-t_R/T_R).$$

Value $T_R$ corresponds to the time constant of the transient response of no-load voltage $U_O$ until it reaches open-circuit voltage $U_R$ which depends on the battery temperature and its history. For example, if values of $soc_i=0.8$ and $soc_{U0}=0.6$ are determined, and if a resting phase $t_R=0.5\,T_R$ is assumed, this yields a weighting factor of 0.39, from which it is possible to calculate the battery charge status as follows:

$$soc = 0.61*0.8 + 0.39*0.6 = 0.722.$$

A deviation in charge status soc thus determined from a simple average can thus be seen.

For the case when $t_R=T_R$, this yields a weighting factor of 0.63, which in the above example leads to a battery charge status soc of 0.674.

The method according to the present invention has the effect that the influence of no-load voltage $U_0$, which is always known with greater accuracy as the resting phase becomes longer, has a greater influence on the results of averaging.

Figure 1:
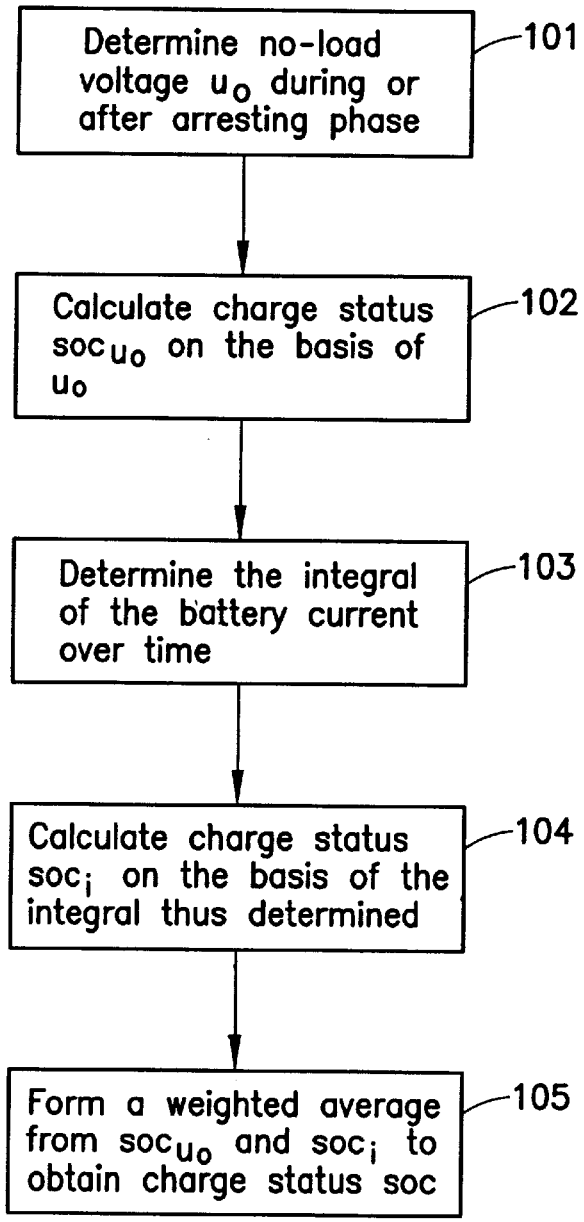
FIG. 1 shows a flow chart to illustrate a preferred embodiment of the method according to the present invention.
Figure 2:
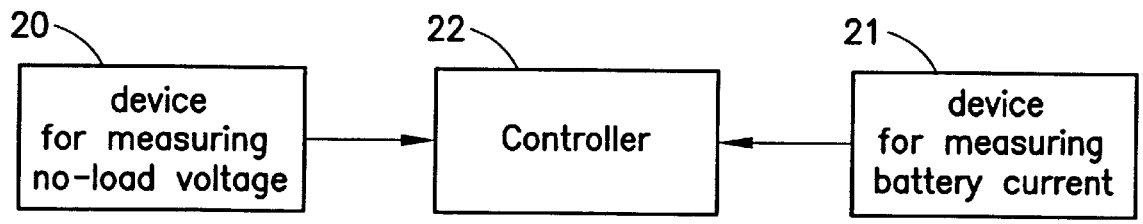
FIG. 2 shows a schematic block diagram of a preferred embodiment of the device according to the present invention.

FIG. 2 shows a device 20 for measuring the no-load voltage of a battery. Furthermore, it also shows a device 21 for measuring the battery current. These devices 20, 21 are connected, optionally with an A/D converter (not shown) connected in between them, to a computer or controller device 22 which calculates battery charge states $soc_{U0}$ and $soc_i$ on the basis of the measured values thus obtained and performs the averaging described above to obtain an average battery charge status soc.

What is claimed is:

1. A method of determining a charge status of a battery, comprising:

determining a first battery charge status as a function of a measurement of a no-load voltage of the battery;

determining a second battery charge status as a function of an integration of a battery current over time; and determining a weighted average from the first and second battery charge statuses in order to obtain an average battery charge status.

2. The method according to claim 1, wherein the battery is an automotive battery.

3. The method according to claim 1, wherein the weighted average is determined on the basis of an equation of the form:

$$soc = (1-gew)*soc_i + gew*soc_{U0}$$

where gew is a weighting factor, for which the inequality $0 \leq gew \leq 1$ holds, $soc_i$ is the second battery charge status, and $soc_{U0}$ is the first battery charge status.

4. The method according to claim 3, wherein the weighting factor is predetermined on the basis of an equation of the form:

$$gew = 1 - \exp(-t_R/T_R)$$

where $t_R$ is a duration of a prior resting phase, and $T_R$ is a time constant of a transient response of the battery no-load voltage until it reaches a battery open-circuit voltage.

5. A device for determining a charge status of a battery, comprising:

a first arrangement for determining a first battery charge status as a function of a measurement of no-load voltage of the battery;

a second arrangement for determining a second battery charge status as a function of an integration of a battery current over time; and a third arrangement for determining a weighted average from the first and second battery charge statuses in order to obtain an average battery charge status.

6. The device according to claim 5, wherein the battery is an automotive battery.

\* \* \* \* \*

UNITED STATES PATENT AND TRADEMARK OFFICE
CERTIFICATE OF CORRECTION

PATENT NO.   : 6,531,874 B2
DATED        : March 11, 2003
INVENTOR(S)  : Dirk Mentgen et al.

It is certified that error appears in the above-identified patent and that said Letters Patent is hereby corrected as shown below:

Column 1,
Delete lines 8-13 and insert -- The present invention relates to a method of determining the charge status of a battery, in particular an automotive lead-acid battery, and a corresponding device. --.

Column 2,
Line 57, delete "from the concrete givens".
Line 58, change "known" to -- conventional --.

Signed and Sealed this

Twenty-third Day of December, 2003

JAMES E. ROGAN
*Director of the United States Patent and Trademark Office*